United States Patent [19]
Okanobu

[11] Patent Number: 5,020,147
[45] Date of Patent: May 28, 1991

[54] FM/AM BROADCAST SIGNAL CONVERTER

[75] Inventor: Taiwa Okanobu, Tokyo, Japan

[73] Assignee: Sony Corporation, Tokyo, Japan

[21] Appl. No.: 335,498

[22] Filed: Apr. 10, 1989

[30] Foreign Application Priority Data

Apr. 26, 1988 [JP] Japan .................. 63-103345

[51] Int. Cl.$^5$ ............................................. H04B 1/16
[52] U.S. Cl. ................................ 455/302; 455/143; 455/189; 455/234
[58] Field of Search ............. 455/180, 188, 189, 190, 455/234, 245, 246, 247, 142, 143, 144, 302

[56] References Cited

U.S. PATENT DOCUMENTS

| | | | |
|---|---|---|---|
| 2,964,622 | 12/1960 | Fire | 455/302 |
| 3,665,507 | 5/1972 | Peic | 455/142 |
| 3,961,262 | 6/1976 | Gassmann | 455/207 |
| 4,255,815 | 3/1981 | Sauer et al. | 455/189 |
| 4,455,681 | 6/1984 | Wile | 455/246 |
| 4,688,263 | 8/1987 | Albridge | 455/189 |
| 4,776,040 | 10/1988 | Ichikawa et al. | 455/234 |
| 4,885,802 | 12/1989 | Ragan | 455/302 |

FOREIGN PATENT DOCUMENTS 0198162 10/1986 European Pat. Off. .
1238789 7/1971 United Kingdom .
2148064 5/1985 United Kingdom .

Primary Examiner—Reinhard J. Eisenzopf
Assistant Examiner—Edward Urban
Attorney, Agent, or Firm—Alvin Sinderbrand; William S. Frommer

[57] ABSTRACT

A received modulated information signal is converted to an intermediate frequency (IF) signal from which modulating information may be recovered by supplying the modulated information signal to two mixers supplied with local oscillating signals of equal frequency but phase shifted with respect to each other. Output signals produced by the mixers are supplied through phase shift circuits which impart predetermined phase shifts thereto such that image signal components present in respective ones of the mixer output signals are phase shifted to be out-of-phase with each other. The phase shifted mixer output signals are combined, whereby the out-of-phase image signal components are substantially cancelled. A filter tuned to the IF frequency is coupled to the output of the combining circuit to pass the mixer output signals having frequencies within a predetermined range of the IF frequency.

25 Claims, 3 Drawing Sheets

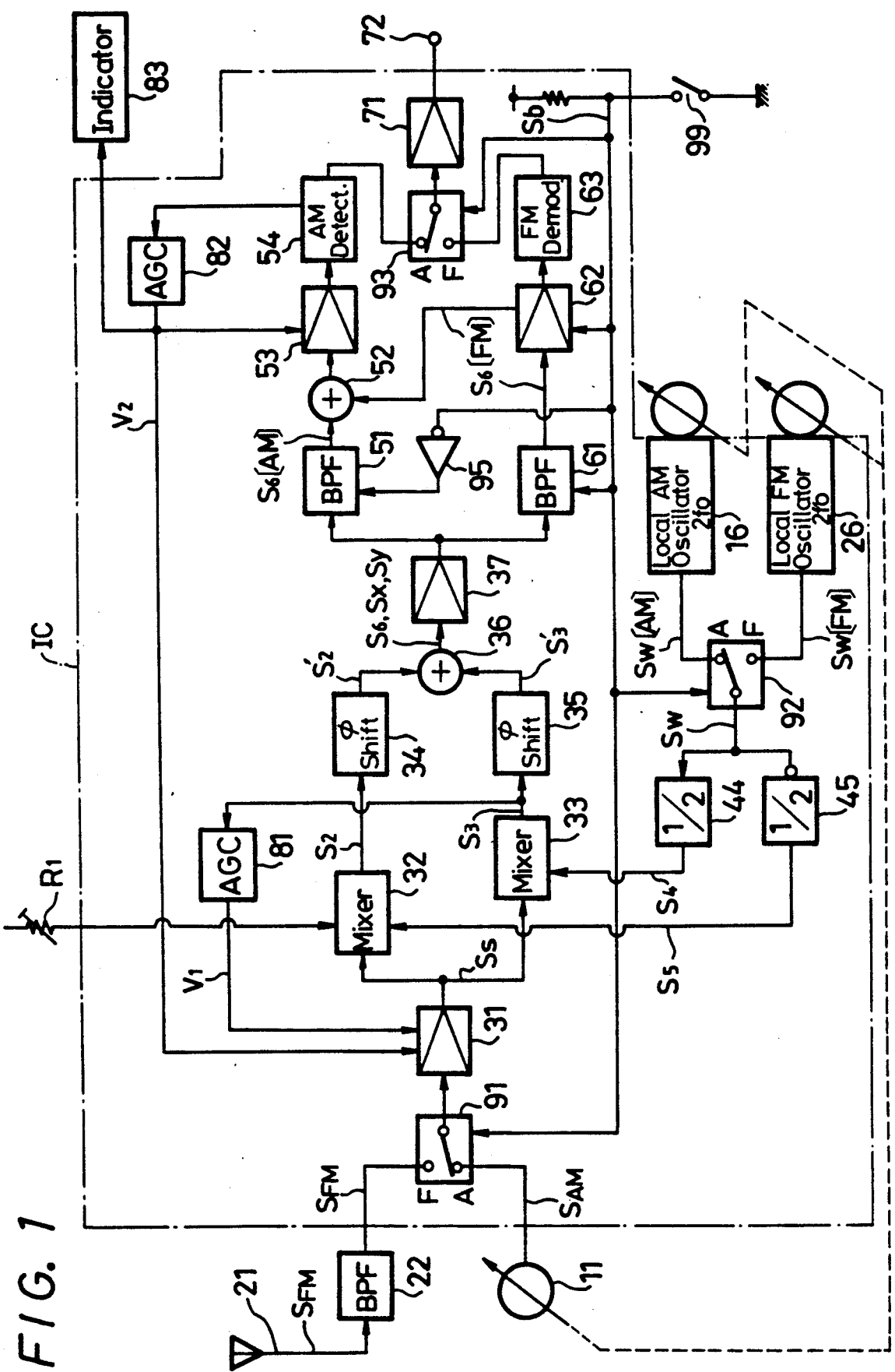

FM/AM BROADCAST SIGNAL CONVERTER

BACKGROUND OF THE INVENTION

1. Field of the Invention

This invention relates to signal receivers for converting a received modulated information signal to an IF signal and, more particularly, to such receivers that can be fabricated on an integrated circuit chip and used to receive either an FM signal, an AM signal, or both.

2. Description of Relevant Prior Art

It has been proposed to fabricate a combined FM/AM receiver on a single integrated circuit (IC) chip. One example is described in Japanese Patent Publication No. 62-48934, filed by the assignee of the instant invention. In that proposal, however, it is difficult, if not impossible, to fabricate the requisite intermediate frequency filter on the same IC chip as the remaining circuitry. This is because the standard IF frequency used in connection with FM broadcast signals is on the order of 10.7 MHz, whereas the standard IF frequency used in connection with AM broadcast signals is on the order of 455 kHz (or, in some instances, 450 kHz). It is appreciated that the wide range needed to accommodate both FM and AM IF frequencies is not easily achieved by a single band pass filter integrated with the FM/AM receiver. Hence, although a combined FM/AM receiver may be formed as a single IC chip, separate band pass filters tuned to 10.7 MHz and 455 kHz, respectively, are needed; and such band pass filters typically are constructed as a ceramic filter attached as an external circuit component to the FM/AM receiver chip.

The use of an externally attached IF filter is accompanied by various drawbacks. For example, this results in an increase in the number of peripheral parts or components which constitute the receiving device. Also, an external element, as opposed to a component simply included in an IC design, restricts the overall layout, or architecture, of the printed circuit board used with the device. Furthermore, the use of external circuits results in a receiver of larger size and thickness, and requires higher production and assembly costs. For example, a combined FM/AM receiver incorporated into a personal stereo audio device, such as a Walkman (registered trademark) audio device increases the size and production costs of that device.

Since the need for providing an externally connected IF filter arises out of the relatively high IF frequencies used, particularly when receiving broadcast FM signals, it has been suggested that the FM IF frequency be substantially reduced so that the IF filter can be formed as an active filter capable of fabrication on the receiver IC chip. In this regard, it has been proposed to reduce the FM IF frequency from the standard frequency of 10.7 MHz to a low frequency of approximately 70 kHz. But, when the IF frequency is so reduced, the rejection characteristics for rejecting or suppressing a so-called image signal component may be substantially deteriorated.

As used in the specification and claims herein, an "image signal component" refers to an undesired one of a double sideband component produced when an FM (or AM) signal is transmitted. For example, in both FM and AM receiving techniques, a received RF signal of frequency $(f_0+\Delta f)$ is mixed with a local oscillating signal of frequency $f_0$ to produce an IF signal of frequency $\Delta f$. The desired RF frequency $(f_0+\Delta f)$ may be accompanied by an image signal component of RF frequency $(f_0-\Delta f)$. When the RF image signal component is subjected to mixing with the local oscillating signal, an IF image signal component of frequency $\Delta f$ is produced and this interferes with the desired, or main IF component. As the IF frequency is reduced, such as from 10.7 MHz to 70 kHz for an FM signal, the ability to reject, block or suppress the IF image signal component is reduced.

If the RF image signal component is due to an adjacent broadcast frequency, the narrowing of the frequency separation between adjacent broadcast frequencies may help reduce the possibility of image interference. For example, frequency separation of about 100 kHz, such as found in Japan, results in minimal image interference.

In addition to deteriorating image component rejection, a reduction in the FM IF frequency to 70 kHz may result in an IF bandwidth that is so limited as to be unable to accommodate the full frequency range of FM broadcast signals. For example, stereo separation may be deteriorated, signal distortion may be increased and beat interference may be pronounced, particularly beat interference caused by the typical SCA component (as is known, the SCA component allows broadcasters to provide a subscription background music service). By reducing the FM IF frequency to 70 kHz, the SCA subcarrier, which typically is on the order of 67 kHz, may produce beat interference.

If a comparable reduction in the AM IF frequency is made, the resultant AM IF frequency may reside in the audible band, thereby resulting in beat interference and other difficulties.

Thus, it had been thought heretofore that FM receivers as well as AM receivers, and particularly combined FM/AM receivers, cannot be readily fabricated on a single IC chip because IF filters tuned to the conventional 10.7 MHz and 455 kHz IF frequencies cannot be integrated therein. As a result, ceramic IF filters have been attached externally to the receiver IC chip, resulting in the drawbacks noted above. Alternatively, a significant reduction in the FM and AM IF frequencies which would allow fabrication of the IF filters onto the receiver IC chip results in serious deteriorations of the performance characteristics of the receiver. As mentioned above, image component rejection and stereo separation are reduced while distortion and beat interference are increased.

OBJECTS AND SUMMARY OF THE INVENTION

Therefore, it is an object of the present invention to provide a receiver with improved operating characteristics for receiving FM or AM or combined FM/AM signals.

Another object of this invention is to provide a receiver in which FM and/or AM IF filters are integrated with the FM and/or AM receiving circuits on an IC chip.

A further object of this invention is to provide a receiver for receiving FM and/or AM broadcast signals and for converting the received signals to FM and/or AM IF signals of IF frequencies that are substantially less than standard FM and AM IF frequencies but which provide good image component rejection and stereo separation while reducing distortion and beat interference.

An additional object of this invention is to provide low cost receiving apparatus for converting a received modulated information signal, such as an FM signal or an AM signal, to an IF signal.

Various other objects, advantages and features of the present invention will become readily apparent from the ensuing detailed description, and the novel features will be particularly pointed out in the appended claims.

In accordance with this invention, apparatus is provided for converting a received modulated information signal to an intermediate frequency (IF) signal from which modulating information may be recovered. First and second mixers are supplied with local oscillating signals which are phase shifted with respect to each other and with the modulated information signal. The outputs of the mixers are phase shifted by an amount sufficient to shift the phases of image signal components present therein such that the image signal components are out-of-phase with each other. The phase shifted output signals derived from the mixers are combined to substantially cancel the out-of-phase image signal components. An IF filter receives the combined, phase-shifted output signals.

In accordance with a preferred embodiment, the mixers, local oscillator, phase shifters, combiner and IF filter all are formed on a single integrated circuit chip.

As one feature of this invention, a variable gain amplifier is used to supply the modulated information signal to the mixers, this amplifier having its gain varied in response to a control signal generated as a function of the magnitude of the output signal produced by at least one of the mixers.

As yet another feature of this invention, the frequency of the local oscillating signals is such that the mixers produce output signals of an IF range that is at least one order of magnitude less than the IF frequency normally produced from the received modulated information signal. If the modulated information signal is an FM signal, the IF output signals produced by the mixers is about two orders of magnitude less than the normal 10.5 MHz FM IF frequency.

In one embodiment of this invention, a variable frequency generator is used to produce the local oscillating signals. Accordingly, different broadcast frequencies may be selected for conversion to IF signals merely by changing the local oscillating signal frequency. In another embodiment, a broadcast RF frequency is converted to a first IF frequency by mixing the RF signal with a variable frequency signal, the frequency of the latter being changed to vary the RF broadcast frequency selected for recovery, and this first IF signal of constant carrier frequency is mixed with a fixed local oscillating signal to produce second IF signals of substantially lower IF frequency which, subsequently, are phase-shifted, combined (to cancel the image signal components) and then filtered to result in the IF signal for demodulation.

In one example, the local oscillating signals supplied to the mixers are 90° out-of-phase with each other; and the output signals produced by the mixers are phase-shifted with respect to each other also by 90°, whereby the image signal components present in the mixer output signals are cancelled and the main signal components therein are reinforced.

In a preferred embodiment, separate local oscillators are selectively coupled to the mixers to produce either FM or AM IF signals which, in turn, are filtered by separate active IF filters which provide FM and AM IF signals for demodulation.

BRIEF DESCRIPTION OF THE DRAWINGS

The following detailed description, given by way of example, will best be understood in conjunction with the accompanying drawings in which:

FIG. 1 is a block diagram of one embodiment of receiving apparatus in accordance with the present invention;

DETAILED DESCRIPTION OF PREFERRED EMBODIMENTS

Figure 4A:
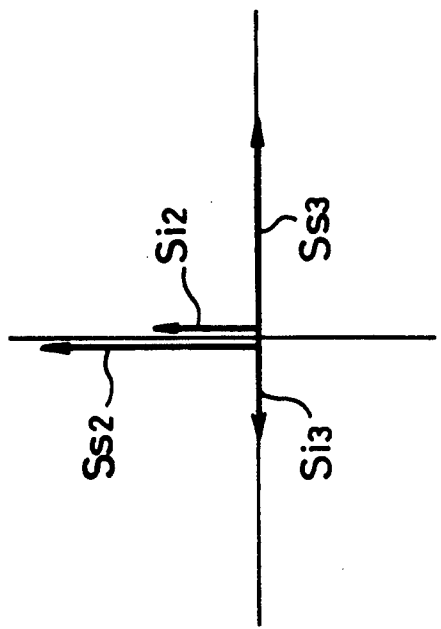
FIGS. 4A and 4B are vector diagrams which are useful in understanding image cancellation achieved by the present invention.

Referring now to the drawings, wherein like reference numerals are used throughout, FIG. 1 is a block diagram of one embodiment of receiving apparatus adapted to convert a received modulated information signal to an intermediate frequency signal from which modulating information may be recovered. In the preferred embodiment, both FM and AM broadcast radio signals may be received and demodulated. Accordingly, the embodiment shown in FIG. 1 is capable of using common circuitry for processing either FM or AM signals, whichever may be selected by the user. Nevertheless, it will become readily apparent that the illustrated apparatus may be modified so as to demodulate only FM broadcast signals or only AM broadcast signals. Likewise, the signals which are received and recovered by the illustrated apparatus need not be limited solely to radio frequencies which are broadcast over-the-air. Other communication links commonly used may be accommodated by the illustrated apparatus. However, for simplification, it is assumed that over-the-air radio waves are received by the illustrated apparatus by conventional antennas, such as tuned antennas.

The apparatus shown in FIG. 1 includes mixers 32 and 33, an input circuit including the aforementioned antennas, a local oscillating circuit comprised of local oscillators 16 and 26 and frequency dividers 44 and 45, phase shifters 34 and 35, a combining circuit 36, IF filters 51 and 61 and demodulating circuits 54 and 63. In addition, selector switches 91, 92 and 93 are provided to enable the illustrated apparatus to receive and process either FM signals or AM signals.

The input circuit includes a tuned AM antenna 11 adapted to receive broadcasted RF AM signals, the particular RF frequency to which the tuned antenna is tuned serves to enhance selection of a desired broadcast channel. Tuned antenna 11 is of conventional design and is coupled to mixers 32 and 33 by way of a variable gain high frequency amplifier 31. Selector switch 91 includes an AM input A and an FM input F, the output of this switch being coupled to amplifier 31. As illustrated, tuned AM antenna 11 is coupled to AM input A of switch 91.

The input circuit also includes an FM antenna 21 coupled to FM input F of switch 91 by a band pass filter 22 having a pass band sufficient to accommodate the usual FM frequency band which, as an example, is on the order of about 88 MHz to 108 MHz. It will be recognized that filter 22 provides preselection to the FM frequency band. Depending upon the state of selector switch 91, variable gain amplifier 31 is supplied either with received AM signals or received FM signals.

An AM/FM mode selector switch 99 (lower right side of the diagram) is provided to control the state of each of selector switches 91, 92 and 93. Preferably, switch 99 is manually operated to produce a control signal $S_b$ of a relatively higher voltage level which, when supplied to the selector switches, controls each switch to couple the FM input F to the output thereof. When control signal $S_b$ exhibits a relatively lower voltage level, each selector switch operates to couple its AM input A to its output. As shown, control signal $S_b$ admits of its higher voltage level when switch 99 is opened and its lower voltage level when this switch is closed. As will be described, the control signal also is supplied to filters 51 and 61 as well as to an amplifier 62 for selectively enabling or disabling the operation of each of these circuits. Suffice it to say that these circuits are enabled when a control signal of higher voltage level is applied thereto.

Mixers 32 and 33 function as heterodyning circuits and are adapted to mix (or heterodyne) the FM or AM signal supplied thereto with a local oscillating signal generated by local oscillating circuitry. As will be described, the local oscillating signals supplied to mixers 32 and 33 admit of the same frequency $f_0$ but are phase shifted relative to each other by 90°. In one embodiment, separate AM and FM oscillating circuits are used to generate separate 90° phase-shifted AM and FM local oscillating signals. It will be appreciated that these local oscillating signals are not amplitude or frequency modulated; and the designation "AM local oscillating signal" and "FM local oscillating signal" is intended to refer simply to the different frequencies exhibited by those signals. In the illustrated embodiment, separate local oscillators 16 and 26 are provided, each generating an oscillating signal of twice the desired local oscillating frequency, these frequencies being separately tunable over ranges from which the AM and FM local oscillating signals are derived. Those of ordinary skill in the art will appreciate that separate variable frequency oscillators are preferred; although a single oscillator capable of generating variable frequency signals in both of the aforementioned frequency ranges may be used.

Oscillator 16 is coupled to the AM input A of selector switch 92 and oscillator 26 is coupled to the FM input F thereof. The output of switch 92 is coupled directly to frequency divider 44 and, by way of an inverter, to frequency divider 45. Each of these frequency dividers may be conventional divide-by-two circuits to produce local oscillating signals $S_4$ and $S_5$, respectively, of desired frequency. As will be described below with respect to FIG. 2, local oscillating signals $S_4$ and $S_5$ exhibit a frequency one-half that of the local oscillator to which it is coupled; and the local oscillating signals $S_4$ and $S_5$ are 90° out-of-phase with respect to each other. These phase-shifted local oscillating signals are coupled to mixers 32 and 33, respectively.

The outputs of mixers 32 and 33 are coupled to phase shifters 34 and 35 which are adapted to impart predetermined phase shifts to the output signals produced by the respective mixers. As will be described below, these phase shifts are such that the output signal produced by mixer 33 undergoes a phase shift of 90° relative to the phase shift imparted by phase shifter 34. Thus, phase shifter 34 may impart a phase shift of −45° while phase shifter 35 provides a phase shift of +45°. Alternatively, phase shifter 34 may provide a phase shift of 0° while phase shifter 35 provides a phase shift of +90°. Other combinations are, of course, contemplated.

The phase shifted output signals derived from phase shifters 34 and 35 are coupled to combining circuit 36 which is adapted to sum these phase-shifted output signals. The summed output from combining circuit 36 is coupled to IF filters 51 and 61 via a buffer amplifier 37. Filters 51 and 61 function as active band pass filters formed of transistors, resistors and capacitors. Filter 51 is a band pass filter tuned to a center frequency on the order of 55 kHz. As will be described, this is the IF frequency produced by mixers 32 and 33 when an AM signal is supplied thereto. The pass band of filter 51 is sufficient to pass the modulating information included in the AM IF signal provided by combining circuit 36.

Similarly, filter 61 is a band pass filter tuned to a center frequency on the order of 150 kHz. This is the IF frequency produced by mixers 32 and 33 when an FM signal is supplied thereto. The pass band of filter 61 is sufficient to pass the modulating information present in the FM IF signal produced by combining circuit 36. As mentioned previously, control signal $S_b$ is coupled to filter 61 to enable this filter to pass IF signals supplied thereto when the control signal admits of its higher voltage level. Control signal $S_b$ is inverted by an inverter 95 and supplied to filter 51 so as to enable this filter to pass IF signals when control signal $S_b$ admits of its relatively lower voltage level. Thus, filters 51 and 61 are enabled mutually exclusively as a function of the voltage level exhibited by control signal $S_b$.

The output of filter 51 is coupled by a summing circuit 52 to a variable gain amplifier 53. The summing circuit is adapted to supply to amplifier 53 a portion of an FM IF signal supplied to amplifier 62 by filter 61. As illustrated, amplifier 62 also is supplied with control signal $S_b$ to be selectively enabled or disabled, depending upon whether the illustrated apparatus is conditioned to receive FM or AM signals.

The outputs of amplifiers 53 and 62 are demodulated; and as shown, amplifier 53 is coupled to an amplitude detector, such as AM detector 54 of conventional construction, and amplifier 62 is coupled to an FM demodulator 63 which also is of conventional construction. The modulated information derived from the AM IF signal is supplied from AM detector 54 to AM input A of selector switch 93. Likewise, the modulated information derived from the FM IF signal is supplied by FM demodulator 63 to FM input F of switch 93. The output of this switch, that is, the demodulated information derived from the AM or FM IF signals is coupled to an output terminal 72 by an amplifier 71.

As mentioned above, amplifiers 31 and 53 preferably are variable gain amplifiers. Filters 51 and 61, as well as phase shifters 34 and 35, are active circuits. Hence, a large input signal supplied to these circuits may result in saturation, thereby disturbing the proper operation thereof. To avoid saturation, the amplitude of the signals supplied to the phase shifters and band pass filters is controlled by automatic gain control (AGC). An AGC signal generator 81 is coupled to the output of one of mixers 32 and 33 (in the illustrated example, AGC circuit 81 is coupled to mixer 33) to generate a gain control signal $V_1$ which is supplied to variable gain amplifier 31.

Thus, AGC control is used to regulate the magnitude of the FM or AM signal supplied to mixers 32 and 33, thereby reducing the possibility of saturating phase shifters 34 and 35 and filters 51 and 61. Similarly, the detected amplitude (or at least a portion thereof) provided by AM detector 54 is supplied to an AGC signal generator 82 which generates a gain control signal $V_2$ supplied to variable gain amplifier 31. It is appreciated that gain control signal $V_2$ provides further amplitude regulation by producing additional gain control over the FM or AM signal amplified by amplifier 31. Gain control signal $V_2$ also is applied to variable gain amplifier 53 to regulate the amplitude of the signal supplied thereby to AM detector 54. Thus, false or erroneous AM detection by detector 54 is substantially prevented.

The output of AGC circuit 82 also is coupled to a visual indicator 83. This indicator is adapted to provide a user with an indication of whether the receiving apparatus is tuned to a broadcast FM or AM frequency. It is expected that control signal $V_2$ exhibits an amplitude which exceeds a predetermined threshold substantially only when a broadcast frequency is received. This amplitude is sufficient to drive indicator 83 thereby providing a suitable tuning indication.

Since filters 51 and 61 may be formed as active circuits, these filters may be fabricated on the same integrated circuit chip as mixers 32, 33, phase shifters 34, 35, combining circuit 36, oscillators 16, 26, etc. Also, selector switches 91, 92 and 93 preferably are solid-state switches likewise fabricated on the same IC chip. In FIG. 1, the circuitry formed on this IC chip is contained within the broken line designated "IC".

Figure 2:
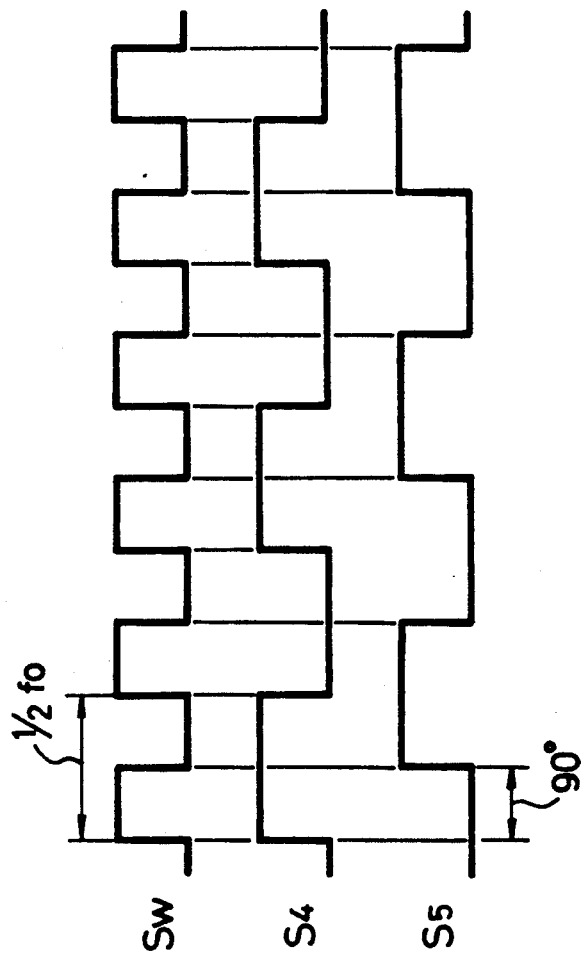
FIG. 2 is a waveform diagram representing the manner in which local oscillating signals are generated.

The manner in which the illustrated receiving apparatus operates now will be described. Let it be assumed that mode selector switch 99 is operated to select the AM receiving mode. Accordingly, switches 91, 92 and 93 exhibit their illustrated conditions, filter 51 is enabled, and filter 61 and amplifier 62 are disabled. Let it be further assumed that the user wishes to receive AM signal $S_{AM}$ of broadcast frequency $(f_0+\Delta f)$, where $f_0$ is the frequency of the local oscillating signals $S_4$ and $S_5$ supplied to mixers 33 and 32, respectively, and $\Delta f$ is the AM IF frequency of, for example, 55 kHz. Local AM oscillator 16 is tuned by the user to generate oscillating signal $S_{WAM}$ of a frequency $2f_0$. This oscillating signal $S_{WAM}$ is supplied directly to frequency divider 44 and, after being inverted, is supplied to frequency divider 45. Each of these frequency dividers functions to divide the frequency of oscillating signal $S_{WAM}$ by a factor of 2, resulting in local oscillating signals $S_4$ and $S_5$. FIG. 2 is a waveform diagram of the signals $S_{WAM}$, $S_4$ and $S_5$. It is seen that local oscillating signals $S_4$ and $S_5$ both exhibit the frequency $f_0$; but these local oscillating signals are phase-shifted by 90° relative to each other. These local oscillating signals may be expressed as:

$$S_4 = \cos \omega_0 t$$

$$S_5 = \sin \omega_0 t$$

where $\omega_0 = 2\pi f_0$. These local oscillating signals are supplied to mixers 33 and 32, respectively.

Figure 3:
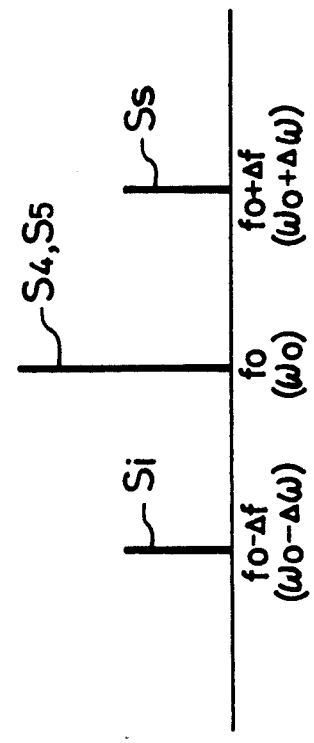
FIG. 3 is a spectral diagram representing main and image signal components which are processed by the present invention.

Tuned AM antenna 11 supplies received AM signals $S_{AM}$ to mixers 32 and 33 by way of variable gain amplifier 31. Let it be assumed that the AM broadcast frequency which the user wishes to receive is equal to $f_0+\Delta f$. This desired broadcast frequency is accompanied by an image signal component which, as defined above, admits of a frequency $f_0-\Delta f$. This image signal component, if not rejected, suppressed or otherwise treated, may produce interference resulting in audible distortion. For the purpose of the following discussion, it is assumed that the AM signal $S_{AM}$ is comprised of a desired, or main component $S_{SAM}$ together with an undesired image signal component $S_{iAM}$. The main, or desired signal may be expressed as $$S_{SAM} = A \sin(\omega_0 + \Delta\omega)t$$

and the undesired image signal component may be expressed as $$S_{iAM} = B \sin(\omega_0 - \Delta\omega)t$$

wherein $\Delta\omega = 2\pi\Delta f$. A spectral diagram of the main AM signal component $S_{SAM}$, the image signal component $S_{iAM}$ and the local oscillating signals $S_4$ and $S_5$ is illustrated in FIG. 3. This figure explains why the undesired image signal component is referred to as an "image" component.

Mixer 32 produces an output signal $S_{2AM}$ formed by mixing local oscillating signal $S_5$ with AM signal $S_{AM}$. This output signal $S_{2AM}$ be expressed as:

$$
\begin{aligned}
2 \times S_{2AM} &= 2 \times (S_{SAM} + S_{iAM}) \times S_5 \\
&= 2[A\sin(\omega_0 + \Delta\omega)t + B\sin(\omega_0 - \Delta\omega)t]\sin \omega_0 t \\
&= A\cos(\omega_0 + \Delta\omega - \omega_0)t - A\cos(\omega_0 + \Delta\omega + \omega_0)t + \\
&\quad B\cos(\omega_0 - \Delta\omega - \omega_0)t - B\cos(\omega_0 - \Delta\omega + \omega_0)t \\
&= A\cos \Delta\omega t + B\cos(-\Delta\omega)t - A\cos(2\omega_0 + \Delta\omega)t - \\
&\quad B\cos(2\omega_0 - \Delta\omega)t \\
&= S_{S2AM} + S_{i2AM} - S_x
\end{aligned}
$$

where $$S_{S2AM} = A \cos \Delta\omega t$$

$$S_{i2AM} = B \cos \Delta\omega t$$

$$S_x = A \cos(2\omega_0 + \Delta\omega)t + B \cos(2\omega_0 - \Delta\omega)t$$

Likewise, mixer 33 mixes local oscillating signal $S_4$ with AM signal $S_{AM}$ to produce output signal $S_{3AM}$. This output signal may be expressed as follows:

$$
\begin{aligned}
2 \times S_{3AM} &= 2 \times (S_{SAM} + S_{iAM}) \times S_4 \\
&= 2[A\sin(\omega_0 + \Delta\omega)t + B\sin(\omega_0 - \Delta\omega)t]\cos \omega_0 t \\
&= S_{S3AM} + S_{i3AM} - S_y
\end{aligned}
$$

where $$S_{S3AM} = A \sin \Delta\omega t$$

$$S_{i3AM} = -B \sin \Delta\omega t$$

$$S_y = A \cos(2\omega_0 + \Delta\omega)t + B \cos(2\omega_0 - \Delta\omega)t$$

From the foregoing, it is appreciated that signals $S_{s2AM}$ and $S_{S3AM}$ are desired, main AM IF signals frequency converted from received AM signal $S_{AM}$. Signals $S_{i2AM}$ and $S_{i3AM}$ are undesired, image signal components of the AM IF signal. The phase relationship of the main and image signal components $S_{S2AM}$, $S_{S3AM}$, $S_{i2AM}$ and $S_{i3AM}$ is as illustrated in FIG. 4A.

Figure 4B:
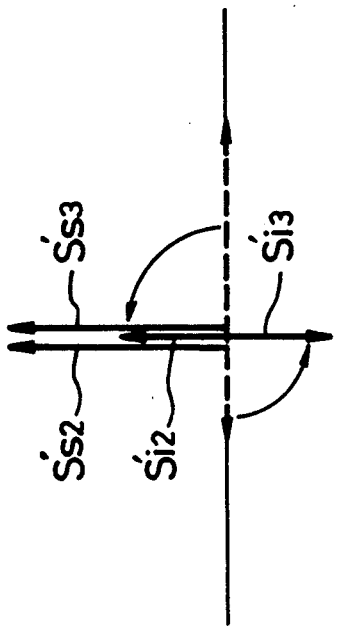

The output signal $S_2$ produced by mixer 32 ($S_2 = S_{S2AM} + S_{i2AM} - S_x$) is phase shifted by phase shifter 34 by an amount $\phi$. The output signal $S_3$ produced by mixer 33 ($S_3 = S_{S3AM} + S_{i3AM} - S_y$) is phase shifted by phase shifter 35 by an amount ($\phi+90°$). Phase shifted output signal S'$_3$ is advanced by 90° relative to phase shifted output signal S'$_2$. As a result of this phase shifting, the phase relationship of the main and image signal components S$_{S2AM}$, S$_{S3AM}$, S$_{i2AM}$ and S$_{i3AM}$ is as represented by the vector diagram shown in FIG. 4B. Thus, main signal components S$_{S2AM}$ and S$_{S3AM}$ are in phase with each other and image signal components S$_{i2AM}$ and S$_{i3AM}$ are out-of-phase with each other. These phase shifted output signals S'$_2$ and S'$_3$ are summed in combining circuit 36, whereupon main signal components S'$_{S2}$ and S'$_{S3}$ reinforce each other and image signal components S'$_{i2}$ and S'$_{i3}$ cancel each other. To make certain that the amplitudes of image signal components S'$_{i2}$ and S'$_{i3}$ are equal, a gain adjust resistor R$_1$ may be operated to adjust the gain of mixer 32 relative to that of mixer 33. By this adjustment, the amplitudes of the image signal components may be made equal to each other such that they cancel in combining circuit 36. The combining circuit thus produces a desired AM IF signal S$_6$ together with higher frequency components S$_x$ and S$_y$.

The desired AM IF signal S$_6$ together with the higher frequency components S$_x$ and S$_y$ provided by combining circuit 36 are supplied to filter 51 by buffer amplifier 37. It is appreciated that filter 51 is tuned to the AM IF frequency $\Delta$f (assumed to be 55 kHz) which, of course, is the frequency of AM IF signal S$_6$. Thus, the IF signal S$_6$ passes through filter 51, whereas the higher frequency components S$_x$ and S$_y$ are blocked. The filtered AM IF signal S$_{6AM}$ is supplied by variable gain IF amplifier 53 to AM detector 54 whereat the information amplitude modulated onto the IF carrier is detected. This detected information is supplied to output 72 by low frequency amplifier 71 which, for example, may comprise an audio amplifier. Also, a portion of the detected amplitude of signal S$_{6AM}$ is supplied to AGC generator 82 which generates AGC signal V$_2$ for controlling the gain of IF amplifier 53 as well as the gain of high frequency amplifier 31. Thus, as mentioned above, the amplitude of signal S$_{AM}$ is regulated to prevent phase shifters 34 and 35 and filter 51 from saturating. Control signal V$_2$ also is supplied to visual indicator 83 to provide a tuning indication. Thus, the user is apprised that oscillator 16 has been properly tuned to a frequency 2f$_0$ for converting a broadcast AM frequency to the desired IF frequency of 55 kHz.

As mentioned previously, further gain control over amplifier 31 is achieved via control signal V$_1$ generated by AGC generator 81 in response to, for example, output signal S$_{3AM}$ produced by mixer 33. Alternatively, signal S$_{2AM}$ produced by mixer 32 may be used by AGC generator 81 to generate control signal V$_1$.

The foregoing has described the reception of a desired AM broadcast signal by the illustrated apparatus. In this mode, control signal S$_b$ admits of a relatively low voltage by which filter 61 and IF amplifier 62 are inhibited. In the embodiment described herein, the AM IF carrier frequency is on the order of 55 kHz and the FM IF carrier frequency is on the order of 150 kHz. These frequencies are sufficiently close to each other such that a component of FM IF signal S$_6$ could be supplied from filter 61 and amplifier 62 to summing circuit 52 if the filter and amplifier are not inhibited. To prevent this component from being supplied to the summing circuit and, thence, to AM detector 54, it is preferred to inhibit filter 61 and IF amplifier 62.

However, when FM reception is desired, mode select switch 99 is operated such that control signal S$_b$ exhibits a relatively higher voltage. Now, filter 51 is inhibited while filter 61 and amplifier 62 are enabled. Also, selector switches 91, 92 and 93 operate to couple signals supplied to the FM input F thereof.

When in the FM receive mode, FM broadcast frequencies received by antenna 21 are filtered by band pass filter 22 and supplied by high frequency amplifier 31 to mixers 32 and 33. It is appreciated that filter 22 functions as a preselector and exhibits a pass band at least equal to the frequency range (88 MHz to 108 MHz) of the FM broadcast band. Local oscillator 26 is tuned to a desired frequency 2f'$_0$ and this frequency is frequency divided by frequency dividers 44 and 45. Mixers 32 and 33 thus are supplied with FM signals S$_{FM}$ and local oscillating signals f'$_0$, the latter being phase-shifted relative to each other by 90°. Mixers 32 and 33, phase shifters 34 and 35 and combining circuit 36 function in the manner described previously in conjunction with AM reception to produce an FM IF signal S$_6$ together with high frequency components S$_x$ and S$_y$. As before, undesired image signal components S$_{i2FM}$ and S$_{i3FM}$ are cancelled; and FM IF signal S$_6$ includes reinforced main FM IF signals S$_{S2FM}$ and S$_{S3FM}$. Thus, if the desired FM broadcast frequency is assumed to be f'$_0$+$\Delta$f, wherein $\Delta$f is the FM IF frequency of 150 kHz, local oscillator 26 desirably exhibits a frequency of 2f'$_0$ and is tunable over the range of just less than 176 MHz to just more than 216 MHz (i. e. twice the FM range). If desired, a broader tuning range may be provided.

Filter 61 is tuned to the FM IF frequency $\Delta$f=150 kHz and passes the FM IF signal S$_6$ while blocking the higher frequency components S$_x$ and S$_y$ produced at the output of combining circuit 36. IF amplifier 62 supplies the FM IF signal S$_{6FM}$ to FM demodulator 63 whereat the modulating information is recovered from the frequency modulated IF signal. The recovered information is coupled to output 72 by low frequency amplifier 71.

IF amplifier 62 supplies a portion of the FM IF signal S$_{6FM}$ to summing circuit 52 which, in turn, supplies this component to amplitude detector 54. Whereas the normal, or standard, FM IF frequency is on the order of 10.7 MHz and whereas the normal, or standard, AM IF frequency is on the order of about 455 kHz, in the present invention, the FM IF frequency is on the order of 150 kHz, or two orders of magnitude less than the standard FM IF frequency, and the AM IF frequency is on the order of 55 kHz, or about one order of magnitude less than the standard AM IF frequency. These IF frequencies are much closer to each other than the standard IF frequencies and, thus, amplitude detector 54 is capable of detecting the amplitude of the FM IF component S$_{6FM}$ supplied thereto by summing circuit 52. The detected amplitude of this FM IF component is supplied to AGC generator 82 to produce the control signal V$_2$ used to control the gain of amplifier 31. This signal also is supplied to indicator 83 to provide the user with a visual indication of the tuning condition of the illustrated apparatus. It is appreciated that if local oscillator 26 is not tuned to a frequency corresponding to an FM broadcast frequency, the amplitude of signal S$_{6FM}$ is too low to be detected by detector 54 and to drive indicator 83.

The present invention offers various advantages over the prior art. For example, and without intending to limit the present invention solely to such advantages, filters 51 and 61 may be formed as active filters fabricated on the same IC chip as those circuits shown within broken line IC. Furthermore, the circuits shown in FIG. 1 are known to those of ordinary skill in the art and need not be specially designed to carry out the functions described above. Additionally, only one set of phase shifters 34 and 35 is needed for both FM and AM reception. Separate sets of phase shifters, one set for FM reception and the other for AM reception, are not necessary. This reduces the overall circuit architecture, thus reducing the physical dimensions of the IC chip. Still further, image signal components $S_{i2}$ and $S_{i3}$ are cancelled in combining circuit 36 for both FM reception and AM reception. Separate level adjusting circuits for cancelling these image signal components are not needed and, moreover, separate image signal component rejection circuitry, one for FM reception and the other for AM reception, also is obviated. Thus, the number of circuit components needed for a combined FM and AM receiver is minimized, thereby reducing overall power consumption of the receiving apparatus.

In the preferred embodiment described herein, the FM IF carrier frequency has been selected to be on the order of 150 kHz. While this frequency is about two orders of magnitude less than the normal, standard FM IF frequency of 10.7 MHz, the reduced IF frequency nevertheless is sufficient to accommodate the band width of the FM signal. Thus, stereo separation remains high and distortion and beat interference are desirably low. Likewise, the reduced AM IF frequency of 55 kHz also is sufficient to accommodate the AM band width.

In the embodiment shown in FIG. 1, the frequency of local oscillator 26 is variable over a relatively broad range of high frequencies. This frequency is $2f_0$, wherein $f_0$ varies from slightly less than 88 MHz to about 108 MHz. Thus, the frequency of local oscillator 26 is variable over the range of approximately 176–216 MHz. If the illustrated receiving apparatus is adapted to receive audio signals which accompany VHF television broadcasting, the frequency $2f_0$ of local oscillator 26 will be greater than 500 MHz in order to convert the television FM audio signals to IF signals. Now, when this signal of such high frequency $2f_0$ is frequency divided by frequency dividers 44 and 45 to apply the requisite local oscillating signals $f_0$ to mixers 32 and 33, it is difficult to maintain the desired 90° phase shift between local oscillating signals $S_4$ and $S_5$ throughout the wide frequency range over which oscillator 26 operates. As a result, image signal components $S_{i2FM}$ and $S_{i3FM}$ may not be sufficiently out-of-phase with each other to cancel. Hence, the image signal rejection characteristic of the illustrated apparatus may be deteriorated. Furthermore, the broad frequency range of 176–216 MHz (and up to 500 MHz) over which local oscillator 26 operates may result in relatively large power consumption, as will frequency dividers 44 and 45, particularly if the latter operate to frequency-divide an oscillating signal in excess of 500 MHz. As an alternative, if oscillator 26 operates over a range of 88–108 MHz (and up to 250 MHz) and is coupled to simple phase shifting circuits to produce the 90° phase shift in the local oscillating signals supplied to mixers 32 and 33, those phase shifting circuits may not be adequate to maintain this 90° phase shift over such a wide frequency range because of, for example, stray capacitance therein. Here too, the image signal rejection characteristic of the illustrated apparatus may be deteriorated.

Figure 5:
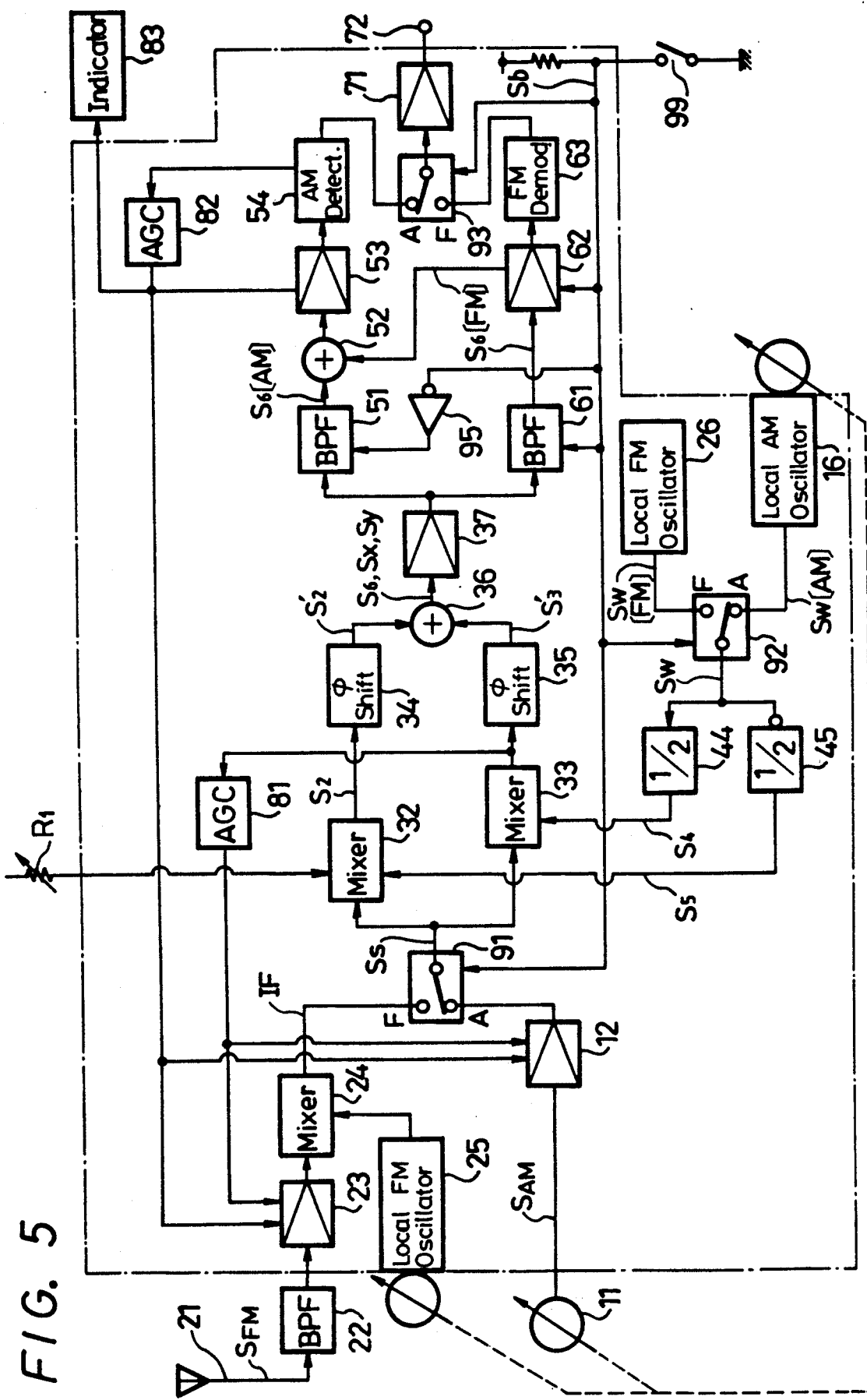
FIG. 5 is a block diagram of another embodiment of receiving apparatus in accordance with the present invention.

To overcome this potential difficulty of operating oscillator 26 over a broad range of high frequencies with the concommitant problem of maintaining a 90° phase shift between local oscillating signals $S_4$ and $S_5$, an alternative embodiment of the receiving apparatus of the present invention is illustrated in FIG. 5. The FIG. 5 embodiment differs from that of FIG. 1 primarily in that local oscillator 26 generates a fixed frequency signal; and a separate, additional "pre-IF" converter is provided to convert the received FM signal $S_{FM}$ to a pre-IF signal, wherein the pre-IF frequency is on the order of about 25 MHz. Referring to FIG. 5, the input circuit used to supply FM signals to mixers 32 and 33 is comprised of FM antenna 21 and band pass filter 22, as was described above in the FIG. 1 embodiment, together with variable gain amplifier 23, mixer 24 and oscillator 25. Amplifier 23 is coupled to the output of filter 22 and preferably is a variable gain amplifier for performing substantially the same function as variable gain amplifier 31 (FIG. 1). The output of amplifier 23 is coupled to mixer 24 which also receives an oscillating signal from oscillator 25. The output of mixer 24 is coupled to the FM input F of swich 91.

To convert the received FM signals, which may be in the range 88–108 MHz, to a pre-IF signal whose carrier is on the order of 25 MHz, oscillator 25 generates an oscillating signal in the range 63–83 MHz.

In the embodiment of FIG. 5, mixers 32 and 33 now are supplied with an FM signal of constant carrier frequency 25 MHz, whereas in the embodiment of FIG. 1, these mixers were supplied with FM signals whose carrier frequencies varied in the range 88–108 MHz. Since the mixers are supplied with an FM signal of constant carrier frequency, local oscillator 26 need not be variable and, thus, simply generates a local oscillating signal of constant frequency. It is recognized that the frequency $2f'_0$ of local oscillator 26 is on the order of about 50 MHz. This frequency is divided by frequency dividers 44 and 45 to supply local oscillating signals $S_4$ and $S_5$ on the order of about 25 MHz, these local oscillating signals being phase shifted relative to each other by 90°. More particularly, if the carrier of the pre-IF signal produced by mixer 24 is equal to 25 MHz, and if the FM IF carrier derived from mixers 32 and 33 is on the order of 150 kHz, then the frequency of local oscillating signals $S_4$ and $S_5$ is (25 MHz–150 kHz), and the frequency $2f'_0$ of local oscillator 26 is (50 MHz–300 kHz).

The remaining circuitry illustrated in FIG. 5 operates in substantially the same way as the corresponding circuitry described above in conjunction with FIG. 1. One additional change in the FIG. 5 embodiment is noted: the AM signal $S_{AM}$ produced by tuned AM antenna 11 is supplied to the AM input A of switch 91 by a variable gain high frequency amplifier 12 which carries out substantially the same function on the received AM signal as is carried out by variable gain high frequency amplifier 31 (FIG. 1). Thus, amplifiers 12 and 23 regulate the amplitudes of the received FM and AM signals to prevent phase shifters 34 and 35 and filters 51 and 61 from being saturated.

By reducing the frequency of the FM signals supplied to mixers 32 and 33, the embodiment shown in FIG. 5 exhibits a good image rejection characteristic and operates with lower power consumption than the embodiment shown in FIG. 1. Furthermore, since a fixed local oscillating frequency is produced by oscillator 26 (FIG. 5), a constant 90° phase separation between local oscillating signals $S_4$ and $S_5$ may be maintained. Additionally, the reduced frequency of oscillator 26 (shown in FIG. 5) reduces the power consumption needed to drive that oscillator and also to drive frequency dividers 44 and 45.

In the interest of brevity, and to avoid unnecessary duplication of the prior description herein, further explanation of the operation of the receiving circuitry illustrated in FIG. 5 is not provided.

While the present invention has been particularly shown and described with reference to preferred embodiments, it will be readily appreciated by those of ordinary skill in the art that various changes and modifications may be made without departing from the spirit and scope of the invention. For example, it has been assumed that the frequency of local oscillating signals $S_4$ and $S_5$ is $f_0$; and the frequency of the modulated signals supplied to mixers 32 and 33 by, for example, selector switch 91 is $(f_0+\Delta f)$. Alternatively, the carrier frequency of the modulated signals supplied to the mixers may be equal to $f_0$, and the frequency of the local oscillating signals $S_4$ and $S_5$ may be $(f_0-\Delta f)$. In the embodiment of FIG. 1, $f_0$ is the broadcast frequency of the FM or AM signals received by the illustrated apparatus. In the FIG. 5 embodiment, $f_0$ is the pre-IF carrier produced by mixer 24 when the apparatus is used to receive FM signals; and $f_0$ is the AM carrier frequency when the apparatus is used to receive AM signals.

Also, in FIGS. 1 and 5, the control signal $V_1$ has been described as being derived from the output signal produced by mixer 33. Alternatively, the control signal may be derived from the output of mixer 32 or from the combined outputs of mixers 32 and 33.

Still further, selector switches 91, 92 and 93 have been described as solid-state switching devices. Alternatively, these selector circuits may be formed as summing circuits supplied with FM and AM signals, with only one of those signals being coupled to the output of the summing circuit. That is, only one input at a time may be enabled. As a further alternative, the selector switches may be formed as relatively simple multiplexers capable of selecting one or the other of the inputs supplied thereto.

As yet another modification, the local oscillating signals $S_4$ and $S_5$ need not be produced by frequency-dividing the output of local oscillator 16 or the output of local oscillator 26. Rather, these local oscillators may generate an oscillating frequency $f_0$ (rather than a local oscillating frequency of $2f_0$, as discussed above), and this local oscillating signal may be supplied to phase shifting circuitry by which the desired 90° phase shift between local oscillating signals $S_4$ and $S_5$ is obtained. Such phase shifting circuitry may be similar to phase shifters 34 and 35. The local oscillators 16 and 26 may be of conventional construction known to those of ordinary skill in the art. As one example, the local oscillators may be formed as phase-locked loops to provide "synthesized" local oscillating signals.

It is intended that the appended claims be interpreted as including the embodiments specifically described herein, the alternatives discussed above and all other equivalents thereto.

What is claimed is:

1. Apparatus for converting an FM broadcast signal to an intermediate frequency signal from which modulating information may be recovered, comprising:

receiving means for receiving the FM broadcast signal;

first and second mixing means for mixing the received FM broadcast signal with first and second local oscillating signals, respectively;

local oscillation means for generating said first and second local oscillating signals exhibiting a predetermined phase shift relative to each other and for supplying said first and second local oscillating signals to said first and second mixing means, respectively, said local oscillating signals being of a frequency such that said mixing means produce output signals in an intermediate frequency range of approximately two orders of magnitude less than the intermediate frequency normally produced from said received FM broadcast signal;

phase shift means coupled to said first and second mixing means for imparting predetermined phase shifts to said output signals produced by said mixing means such that image signal components present in respective ones of said produced output signals are phase shifted to be out-of-phase with each other;

combining means coupled to said phase shift means for combining said phase shifted output signals, whereby the out-of-phase image signal components are substantially cancelled; and filter means coupled to said combining means and tuned to the intermediate frequency which is approximately two orders of magnitude less than the normal intermediate frequency for passing said output signals produced by said mixing means having frequencies within a predetermined range of said intermediate frequency which is approximately two orders of magnitude less than the normal intermediate frequency.

2. The apparatus of claim 1 wherein the normal intermediate frequency of said broadcast FM signal is about 10.5 MHz, and wherein said frequency of said local oscillating signals is such that said mixing means produce output signals of an intermediate frequency range of about two orders of magnitude less than 10.5 MHz.

3. The apparatus of claim 1 wherein said local oscillation means includes fixed frequency generating means for generating local oscillating signals of a fixed, predetermined frequency; and wherein said receiving means comprises input mixing means supplied with said received FM broadcast signal, and variable frequency generating means coupled to said input mixing means for supplying a signal of variable frequency to select a particular FM broadcast signal frequency for reception and recovery, whereby said input mixing means supplies to said first and second mixing means an input IF carrier signal of substantially constant carrier frequency modulated with said information.

4. Apparatus for converting either an FM or an AM broadcast signal to an intermediate frequency signal from which modulating information may be recovered, comprising:

receiving means for receiving the FM or AM signal from which a respective predetermined intermediate frequency is normally produced;

first and second mixing means for mixing the received FM or AM signal with FM or AM local oscillating signals, respectively;

local oscillating means for generating first and second FM local oscillating signals exhibiting a predetermined phase shift relative to each other in which the frequency of said FM local oscillating signals is such that said first and second mixing means produce output FM intermediate frequency signals with frequencies approximately two orders of magnitude less than the FM intermediate frequency normally produced, and for generating first and second AM local oscillating signals exhibiting said predetermined phase shift relative to each other in which the frequency of said AM local oscillating signals is such that said first and second mixing means produce output AM intermediate frequency signals with frequencies approximately one order of magnitude less than the AM intermediate frequency normally produced;

selector means for selecting said first and second phase shifted FM local oscillating signals or said first and second phase shifted AM local oscillating signals to be supplied to said first and second mixing means;

phase shift means coupled to said first and second mixing means for imparting predetermined phase shifts to the output signals produced by said mixing means such that image signal components present in respective ones of said produced output signals are phase shifted to be out-of-phase with each other;

combining means coupled to said phase shift means for combining the phase shifted output signals, whereby the out-of-phase image signal components are substantially canceled; and FM and AM filter means coupled to said combining means and tuned to the FM intermediate frequency which is approximately two orders of magnitude less than said FM intermediate frequency normally produced and the AM intermediate frequency which is approximately one order of magnitude less than said AM intermediate frequency normally produced, respectively, for passing said output signals produced by said mixing means having frequencies within a predetermined range of the FM intermediate frequency which is approximately two orders of magnitude less than said FM intermediate frequency normally produced or the AM intermediate frequency which is approximately one order of magnitude less than said AM intermediate frequency normally produced.

5. The apparatus of claim 4 wherein said first and second mixing means, said local oscillating mean, said phase shift means, said combining means and said FM and AM filter means are all formed on a single integrated circuit chip.

6. The apparatus of claim 4 wherein said receiving means includes variable gain amplifying means for varying the gain of said FM or AM signal in response to a control signal; and gain control signal generating means coupled to at least one of said first and second mixing means for generating said control signal as a function of the magnitude of the output signal produced thereby.

7. The apparatus of claim 6 further comprising amplitude detecting means for detecting the amplitude of an FM IF signal or an AM IF signal; means for selectively supplying to said amplitude detecting means either the FM IF signal passed by said FM filter means or the AM IF signal passed by said AM filter means; further gain control signal generating means coupled to said amplitude detecting means for generating a further control signal as a function of the detected amplitude; and means for varying the gain of said variable gain amplifying means with said further control signal.

8. The apparatus of claim 7 further comprising mode select means for selecting an FM receiving mode or an AM receiving mode to enable said FM filter means or said AM filter means to supply the FM IF signal or the AM IF signal to said amplitude detecting means.

9. The apparatus of claim 4 wherein said phase shift means imparts a relative phase shift of about 90° with respect to each other to the output signals produced by said first and second mixing means and wherein said predetermined phase shift of said first and second FM or AM local oscillating signals generated by said local oscillation means is about 90°.

10. The apparatus of claim 4 wherein said combining means comprises summing means for summing the phase-shifted output signals.

11. The apparatus of claim 4 further comprising mode select means to select an FM receiving mode or an AM receiving mode for controlling said receiving means to supply the received FM or AM signal to said first and second mixing means and for controlling said selector means to select phase shifted FM or AM local oscillating signals to be supplied to said first and second mixing means.

12. The apparatus of claim 11 wherein said FM and AM filter means comprise active filters coupled to said mode select means and selectively enabled in accordance with the receiving mode selected by said mode select means.

13. Apparatus for converting a broadcast AM signal to an intermediate frequency signal from which modulating information may be recovered, comprising:

receiving means for receiving the AM broadcast signal;

first and second mixing means or mixing the received AM broadcast signal with first and second local oscillating signals, respectively;

local oscillation means for generating said first and second local oscillating signals exhibiting a predetermined phase shift relative to each other and for supplying said first and second local oscillating signals to said first and second mixing means, respectively, said local oscillating signals being of a frequency such that said mixing means produce output signals in an intermediate frequency range of approximately one order of magnitude less than 455 kHz which is the intermediate frequency normally produced from said received AM broadcast signal;

phase shift means coupled to said first and second mixing means for imparting predetermined phase shifts to said output signals produced by said mixing means such that image signal components present in respective ones of said produced output signals are phase shifted to be out-of-phase with each other;

combining means coupled to said phase shift means for combining said phase shifted output signals, whereby the out-of-phase image signal components are substantially canceled; and filter means coupled to said combining means and tuned to the intermediate frequency which is approximately one order of magnitude less than 455 kHz for passing said output signals produced by said mixing means having frequencies within a predetermined range of said intermediate frequency which is approximately one order of magnitude less than 455 kHz.

14. The apparatus of claim 13 wherein said first and second mixing means, said local oscillation means, said phase shift means, said combining means and said filter means are all formed on a single integrated circuit chip.

15. The apparatus of claim 13 wherein said receiving means includes variable gain amplifying means for varying the gain of said AM broadcast signal in response to a control signal; and gain control signal generating means coupled to at least one of said first and second mixing means for generating said control signal as a function of the magnitude of the output signal produced by said mixing means.

16. The apparatus of claim 15 further comprising amplitude detecting means coupled to said filter means for detecting the amplitude of an intermediate frequency passed by said filter means; further gain control signal generating means coupled to said amplitude detecting means for generating a further control signal as a function of the detected amplitude; and means for varying the gain of said variable gain amplifying means with said further control signal.

17. The apparatus of claim 13 wherein said local oscillation means includes variable frequency generating means operable to vary the frequency of said local oscillating signals to select a particular AM broadcast signal frequency for reception and recovery.

18. The apparatus of claim 13 wherein said phase shift means imparts a relative phase shift of about 90° with respect to each other to the output signals produced by said first and second mixing means.

19. The apparatus of claim 18 wherein the output signals produced by said first and second mixing means include main signal components that are approximately 90° out-of-phase with each other.

20. The apparatus of claim 13 wherein said predetermined phase shift of said first and second local oscillating signals generated by said local oscillation means is about 90°.

21. The apparatus of claim 20 wherein said local oscillation means comprises a source of oscillation, first and second frequency divider means coupled to said source for dividing the frequency of said oscillation by two, and means for supplying said oscillation to one of said frequency divider means in inverted form.

22. The apparatus of claim 13 wherein said combining means comprises summing means for summing the phase-shifted output signals.

23. Apparatus for converting either an FM or an AM broadcast signal to an intermediate frequency signal from which modulating information may be recovered, comprising:
receiving means for receiving the FM or AM signal;
first and second mixing means for mixing the received FM or AM signal with FM or AM local oscillating signals, respectively;
local oscillating means for generating first and second FM local oscillating signals exhibiting a predetermined phase shift relative to each other in which the frequency of said FM local oscillating signals is such that said first and second mixing means produce output FM intermediate frequency signals with frequencies approximately two orders of magnitude less than 10.5 MHz which is the FM intermediate frequency normally produced, and for generating first and second AM local oscillating signals exhibiting said predetermined phase shift relative to each other in which the frequency of said AM local oscillating signals is such that said first and second mixing means produce output AM intermediate frequency signals with frequencies approximately one order of magnitude less than 455 kHz which is the AM intermediate frequency normally produced;
selector means for selecting said first and second phase shifted FM local oscillating signals or said first and second phase shifted AM local oscillating signals to be supplied to said first and second mixing means;
phase shift means coupled to said first and second mixing means for imparting predetermined phase shifts to the output signals produced by said mixing means such that image signal components present in respective ones of said produced output signals are phase shifted to be out-of-phase with each other;
combining means coupled to said phase shift means for combining the phase shifted output signals, whereby the out-of-phase image signal components are substantially canceled; and
FM and AM filter means coupled to said combining means and tuned to the FM intermediate frequency which is approximately two orders of magnitude less than 10.5 MHz and the AM intermediate frequency which is approximately one order of magnitude less than 455 kHz, respectively, for passing said output signals produced by said mixing means having frequencies within a predetermined range of the FM intermediate frequency which is approximately two orders of magnitude less than 10.5 MHz or the AM intermediate frequency which is approximately one order of magnitude less than 455 kHz.

24. The apparatus of claim 23 wherein said local oscillating means includes variable frequency generating means operable to vary the frequency of said FM or AM local oscillating signals to select a particular FM or AM broadcast signal frequency for reception and recovery.

25. The apparatus of claim 23 wherein said local oscillating means includes fixed frequency generating means for generating FM local oscillating signals of a fixed, predetermined frequency; and wherein said input means comprises receiving mixing means supplied with FM broadcast signals, and variable frequency generating means coupled to said input mixing means for supplying a signal of variable frequency to select a particular FM broadcast signal frequency for reception and recovery, whereby said input mixing means supplies to said first and second mixing means an input IF carrier signal of substantially constant carrier frequency FM modulated with said information.

* * * * *